United States Patent
Tai et al.

(10) Patent No.: US 8,097,927 B2
(45) Date of Patent: Jan. 17, 2012

(54) HIGHLY SENSITIVE PHOTO-SENSING ELEMENT AND PHOTO-SENSING DEVICE USING THE SAME

(75) Inventors: Mitsuharu Tai, Kokubunji (JP); Toshio Miyazawa, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 517 days.

(21) Appl. No.: 12/000,402

(22) Filed: Dec. 12, 2007

(65) Prior Publication Data

US 2008/0164473 A1 Jul. 10, 2008

(30) Foreign Application Priority Data

Jan. 9, 2007 (JP) ................... 2007-001303

(51) Int. Cl.
*H01L 27/14* (2006.01)
(52) U.S. Cl. . 257/431; 257/414; 257/428; 257/E31.054; 438/57
(58) Field of Classification Search .......... 257/431, 257/E31.054, 414, 428; 438/57
See application file for complete search history.

(56) References Cited

U.S. PATENT DOCUMENTS

| 6,570,184 B2 | 5/2003 | Horikoshi et al. |
| 7,495,272 B2 | 2/2009 | Maruyama et al. |
| 7,514,762 B2 * | 4/2009 | Deane ............... 257/538 |

FOREIGN PATENT DOCUMENTS

| JP | 2005-228895 | 2/2004 |
| JP | 2006-003857 | 8/2004 |

OTHER PUBLICATIONS

"Applications of Large Area Image Sensors", Large Area Image Sensor Arrays, pp. 204-221.
Kazuhiro Maeda et al., "System-LCD with Monolithic Ambient-Light Sensor System", Mobile Liquid Crystal Business Department, System Liquid Crystal Second Business Division, Development Technology Section, pp. 35-39,and English translation pp. 1-16.

* cited by examiner

*Primary Examiner* — Kenneth Parker
*Assistant Examiner* — John Lin
(74) *Attorney, Agent, or Firm* — Stites & Harbison PLLC; Juan Carlos A. Marquez, Esq.

(57) ABSTRACT

The present invention provides an image display unit integrated with a photo-sensor, comprising a photo-sensing element with high sensitivity and low noise and a polycrystalline silicon TFT prepared at the same time on an insulating substrate using planer process. After a first electrode 11 and a second electrode 12 of the photo-sensing element are made of polycrystalline silicon film, a light receiving layer (photo-electric conversion layer) 13 of the photo-sensing element is prepared by amorphous silicon film on upper layer. In this case, a polycrystalline silicon TFT is prepared at the same time.

20 Claims, 12 Drawing Sheets

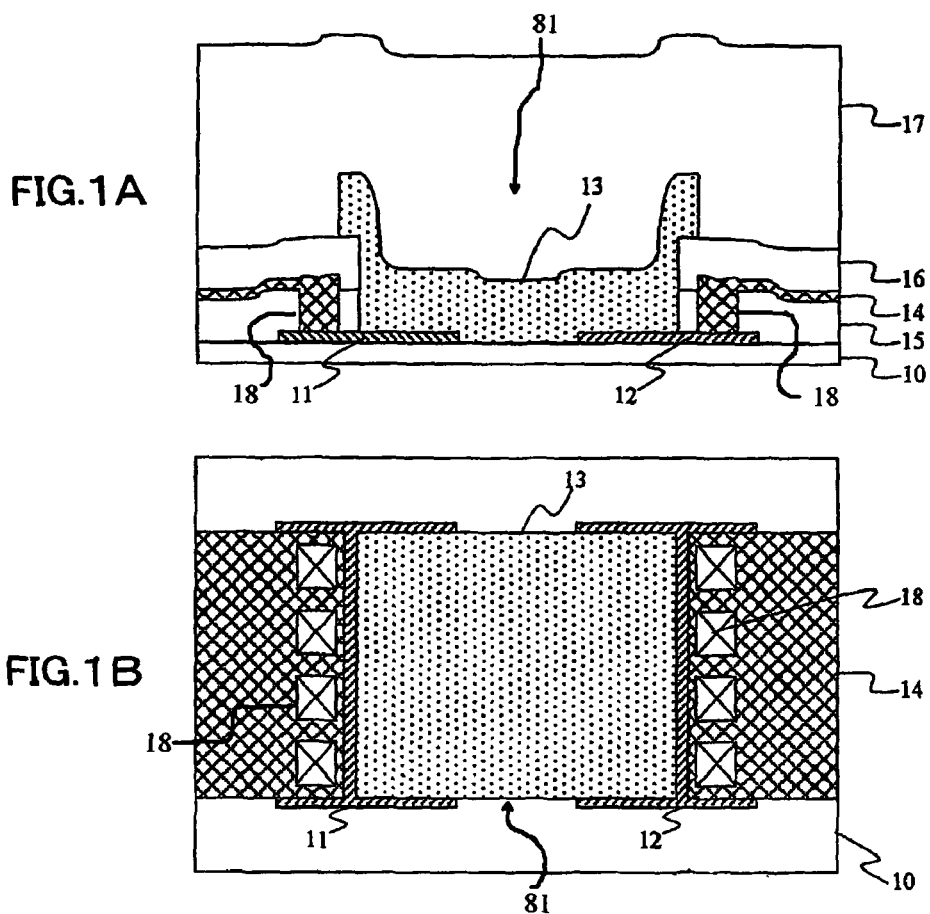
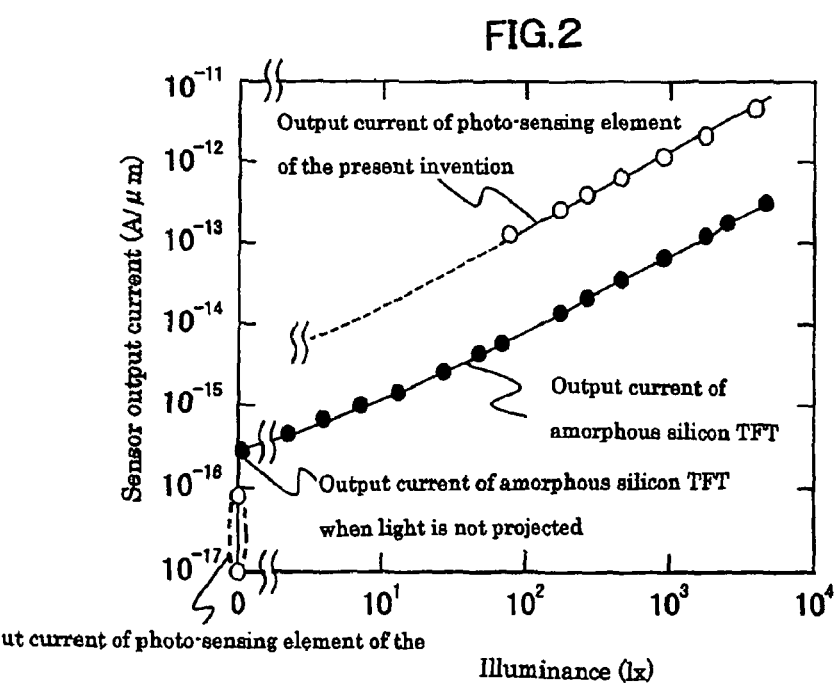

Transfer characteristics of low temperature polycrystalline silicon TFT manufactured at the same time as photo-sensing element of the present invention Transfer characteristics of low temperature polycrystalline silicon TFT of the prior art

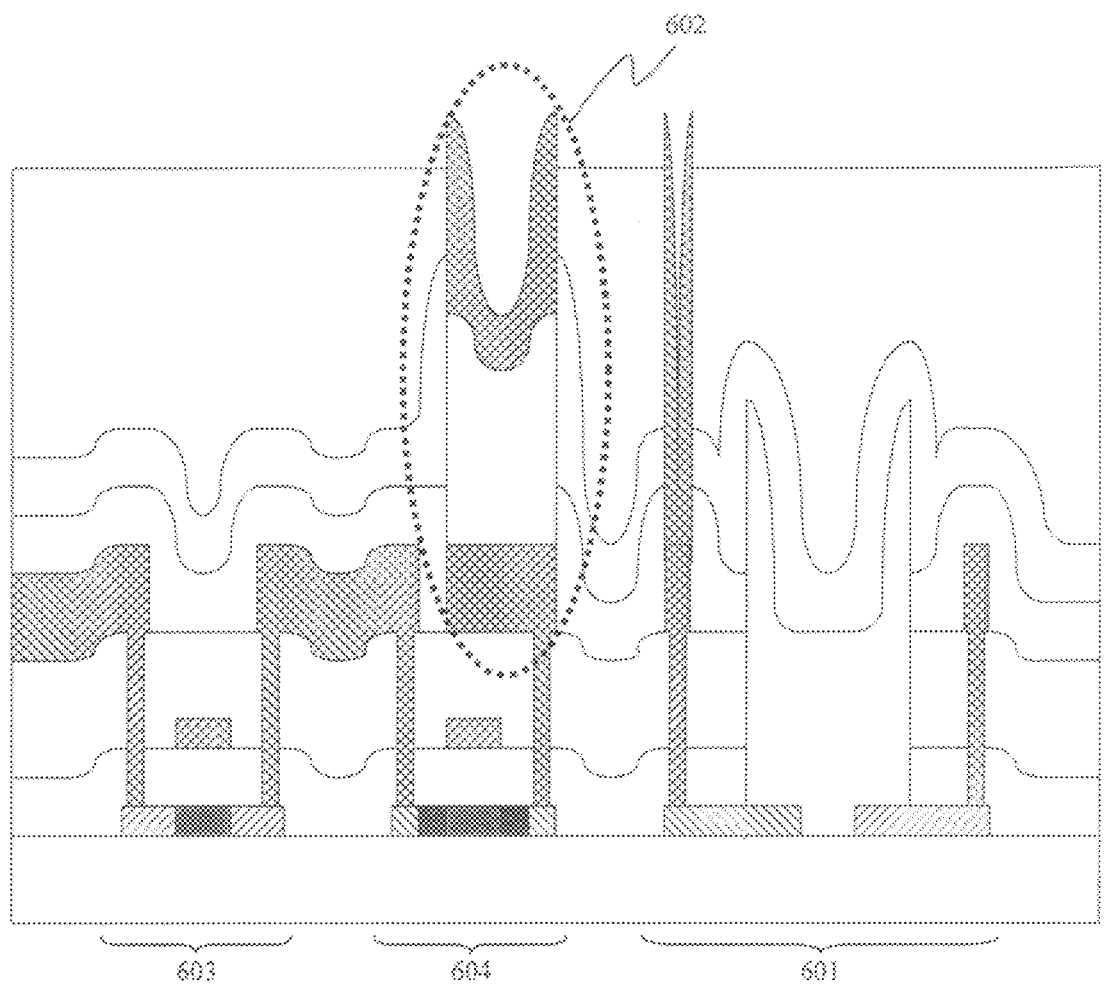

FIG.9
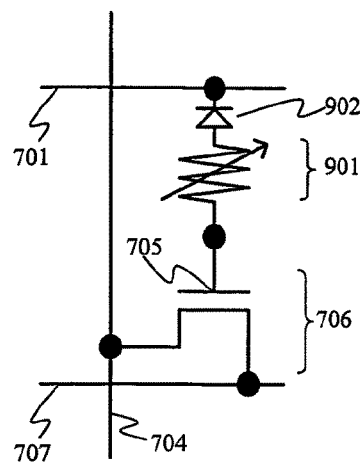
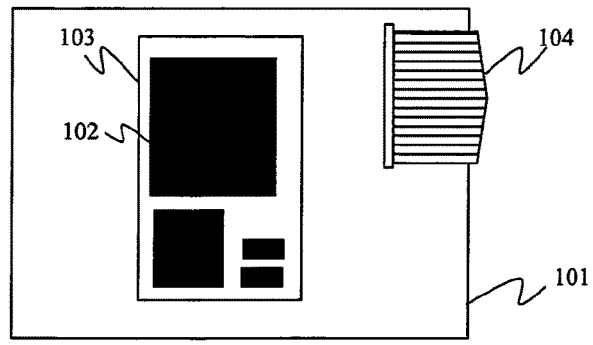
FIG.10A
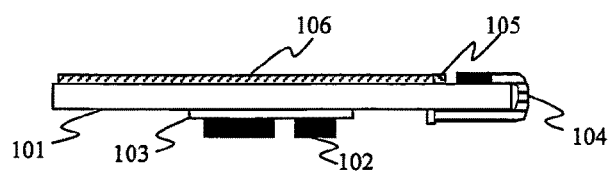
FIG.10B
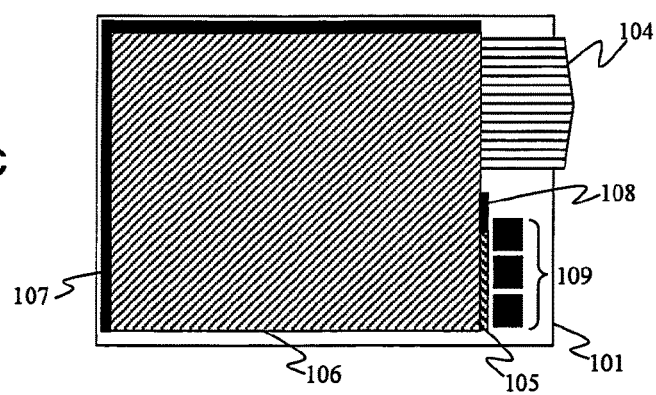
FIG.10C

HIGHLY SENSITIVE PHOTO-SENSING ELEMENT AND PHOTO-SENSING DEVICE USING THE SAME

BACKGROUND OF THE INVENTION

1. Field of the Invention

The present invention relates to a thin-film photo-sensing element formed on an insulating film substrate and to a photo-sensing device using the same. In particular, the invention relates to an optical sensor array such as an X-ray imaging device, a near-infrared light detector for biometrics, etc. and an image display unit integrated with a display panel with touch panel function, ambient light detecting function, and input function using photo-sensor, e.g. low temperature process semiconductor thin-film transistor used in liquid crystal display, organic electroluminescence display, inorganic electroluminescence display, and electro chromic display, and low temperature process photoconductive element or low temperature process photo-diode element.

2. Description of the Prior Art

X-ray imaging device is now indispensable as a medical treatment device, and there are strong and continuous demands to simplify the operation of the device and to produce it at lower cost. Also, in recent years, special notice has been given on the means for biometrics to obtain information from finger vein or palm vein, and it is an imminent problem to have a device or a system for reading the information of this type. In such device or system, a sensor array for optical detection in a certain area, i.e. the so-called area sensor, for reading these types of information, and this area sensor must be provided at lower cost. To satisfy these requirements, a method has been proposed in the Non-Patent Document 1 as given below, according to which an area sensor is prepared by semiconductor forming process (planer process) on an inexpensive insulating substrate typically represented by glass substrate.

In the field of the products different from the area sensor, the photo-sensor is also required on a medium-to-small size display. The medium-to-small size display is applied for display purpose in mobile devices such as handy phone, digital still camera, PDA (personal digital assistant), or display on board. Multiple functions and high performance characteristics are required on these types of devices and systems. Attention is now focused on the photo-sensor as effective means for adding ambient light detecting characteristics (see the Non-Patent Document 2 given below) and touch panel functions. However, unlike the large size display, panel cost is low in the medium-to-small size display. This means that the cost is increased for mounting the photo-sensor or the sensor driver. Therefore, when a pixel circuit is prepared on a glass substrate by semiconductor forming process (planer process), special notice is now given on the technique to prepare the photo-sensor or the sensor driver and on the method to manufacture them at lower cost.

The important issues in the groups of products as described above are to prepare a photo-sensing element or a sensor driver on an inexpensive insulating substrate. The sensor driver typically comprises LSI, and it usually requires MOS transistor deposited on monocrystalline silicon wafer or a switching element with high performance characteristics of similar type. To solve such problems, the technique as described below seems to be essential.

As pixel and pixel driver circuit element for an active matrix type liquid crystal display, an organic electroluminescence display, or an image sensor, the thin-film transistor (hereinafter referred as "polycrystalline semiconductor TFT") has been developed, which is made up by polycrystalline semiconductor. Compared with other types of driver circuit elements, the polycrystalline semiconductor TFT is advantageous in that it has higher driving ability. Peripheral driver circuit can be prepared on the same glass substrate as pixel. As a result, this is convenient for attaining the customization of circuit specification and low cost production by simultaneously performing pixel designing and preparation process and for achieving high reliability by avoiding mechanical fragility of the connections of the driving LSIs and pixels.

The polycrystalline semiconductor TFT for liquid crystal display is prepared on a glass substrate for the purpose of reducing the manufacturing cost. In the process to prepare TFT on the glass substrate, process temperature is determined by heat-resistant temperature of the glass. As a method to prepare polycrystalline semiconductor thin-film of high quality without giving thermal damage to the glass substrate, ELA method (excimer laser annealing method) is known, according to which the semiconductor layer is molten and re-crystallized. The polycrystalline semiconductor TFT obtained by this method has driving ability more than 100 times as high as that of TFT (with the channel made of amorphous semiconductor) as used in the conventional type liquid crystal display, and some of the circuits such as driver circuit can be mounted on the glass substrate.

With regard to the photo-sensor, a method to use the polycrystalline semiconductor TFT and a method to use a PIN type diode in addition to pixel circuit and driver circuit are described in the Patent Document 1 as given below. The characteristics required for the photo-sensor are high sensitivity and low noise. If it is limited to the important characteristics of the photo-sensing element, "high sensitivity" means to issue as high signal as possible with respect to a light with certain intensity. This means that a material and an element structure with high light-to-current conversion efficiency are required. "Low noise" means that the signal is as low as possible when the light is not projected.

FIG. 11 represents cross-sectional views each showing a conventional type photo-sensing element. FIG. 11 (a) shows a PIN type diode element of vertical structure using amorphous silicon layer as a photoelectric conversion layer 113. FIG. 11 (b) shows a TFT element of lateral structure, which uses amorphous silicon film as the photoelectric conversion layer 113 and in which electric charge flows in parallel to the connected surface. Both of these serve as photo-sensing elements.

The photo-sensing element as shown in FIG. 11 (a) comprises a photoelectric conversion layer 113 of amorphous silicon film interposed between a first metal electrode layer 111 and a second metal electrode layer 112, and an impurity induced layer 120, which is prepared between the photoelectric conversion layer 113 and each of the electrode layers. This photo-sensing element is disposed on an insulating substrate 110. Each of the electrode layers is connected to an electrode line 114 insulated by an interlayer insulating film 115 and is covered with a passivation film 117.

The photo-sensing element shown in FIG. 11 (b) comprises a source electrode 131, a gate electrode 132, a drain electrode 133 and a photoelectric conversion layer 113 made of amorphous silicon film. Further, it comprises an impurity induced layer 120 disposed on boundary surface between the photoelectric conversion layer 113 and each of the electrodes. This photo-sensing element is mounted on the insulating substrate 110 and is covered with a passivation film 117.

In FIG. 11, as a semiconductor material to be used in the photoelectric conversion layer 113 of the sensor element disposed on the insulating substrate 110, a silicon type material such as silicon, silicon-germanium, etc. should be used because due consideration must be given on environmental problem or process coordination when driver circuit (or pixel circuit) is formed at the same time. When the silicon type material is used, among the light components absorbed in the wavelength range from infrared light to visible light, almost all of the light components are converted to electric current. This means that a material having higher absorption coefficient is suitable as the material for the photo-sensing element.

Also, when attention is given on solid phase status (hereinafter referred as "phase status") of semiconductor such as amorphous, crystalline or polycrystalline semiconductor, absorption coefficient of the amorphous material is at the highest for the entire wavelength range and this has high resistance. In this respect, amorphous material is advantageous and suitable as the material of the sensor element.

However, when the amorphous material is used in the sensor element, the performance characteristics of the switching element are not sufficient, and it is not possible to have the driver circuit at the same time. For instance, when TFT is made of amorphous silicon material, which is optimal as the material for the sensor element, field effect mobility is 1 cm$^2$/Vs or lower. For this reason, high sensor characteristics can be attained by preparing the sensor array as the structure shown in FIG. 12, while switching characteristics can be provided by mounting the driver LSI and by connecting via the means such as FPC.

With regard to the structure, overall area can be generally increased when vertical structure as shown in FIG. 11 (a) is adopted compared with the case of the lateral structured type shown in FIG. 11 (b). Because the distance of shifting of electric charge to the electrode is shorter, the generated electric charge can be efficiently collected. As a result, higher output can be obtained.

When the material is monocrystalline, vertical structure can be adopted. However, high temperature of 1000° C. or higher is required for the manufacturing process, and it is not possible to manufacture on an inexpensive substrate such as glass substrate.

When the material is polycrystalline, TFT with such quality as to make up a driver circuit can be manufactured from polycrystalline material obtained by ELA method (excimer laser annealing method). However, it is not possible to have vertical structure. Also, because film thickness is limited to about 100 nm at the maximum, most of the incident light components do not pass through the film. Polycrystalline film with higher film thickness can be deposited by chemical vapor deposition (hereinafter referred as "CVD"). However, the performance characteristics of the switching element are not sufficient as in the case of amorphous material, and it is not possible to make up the driver circuit.

The Patent Document 2 as given below proposes a method to manufacture the switching element to make the driver circuit by using polysilicon film and to manufacture the photo-sensing element by using amorphous silicon film and to combine them. According to this method, the driver circuit (and pixel circuit) and the sensor element can be prepared on the same insulating substrate. However, longer process is required for the manufacture, and the number of the photo-lithographic processes is increased. This leads to higher manufacturing cost.

[Non-Patent Document 1] "Technology and Applications of Amorphous Silicon"; pp. 204-221.
[Non-Patent Document 2] SHARP Technical Journal, Vol. 92 (2005); pp. 35-39.
[Patent Document 1] JP-A-2006-3857.
[Patent Document 2] JP-A-2005-228895

SUMMARY OF THE INVENTION

It is an object of the present invention to manufacture a photo-sensing element of high sensitivity and low noise and a sensor driver circuit (and pixel circuit and other circuits if necessary) on the same insulating substrate, and to provide a low-cost area sensor with a sensor driver circuit integrated in it or to provide an image display unit integrated with the photo-sensing element in it.

According to the invention, two electrodes, i.e. the sensor driver circuit (and pixel circuit and other circuits if necessary) and the photo-sensing element are manufactured by using polycrystalline silicon film or polycrystalline silicon-germanium film. Then, amorphous silicon film is deposited, and a light receiving layer (photoelectric conversion layer) of the photo-sensing element is prepared on its upper layer. In so doing, switching characteristics of the sensor driver circuit can be maintained while the number of manufacturing processes is reduced, and high sensitivity and low noise characteristics of the photo-sensing element prepared by amorphous silicon film can be maintained.

For the purpose of giving high additional functions to the conventional type TFT driving display, additional functions must be added. As the means for this purpose, the incorporation of the photo-sensor is very useful from the viewpoint of the functions to be added. Also, the area sensor, in which the photo-sensor is arranged in array, is useful for medical application or application for biometrics, and it is important to manufacture the area sensor at lower cost.

According to the present invention, it is possible to provide the product with high reliability at lower cost because high-performance sensor and sensor driving circuit can be prepared on inexpensive glass substrate at the same time.

BRIEF DESCRIPTION OF THE DRAWINGS

FIG. 1 represents conceptual drawings, each showing a photo-sensing element of the present invention;

FIG. 2 is a diagram showing the relation between sensor output current and illuminance;

FIG. 5 (b) represents manufacturing process of a photo-sensing element and a polycrystalline silicon TFT;

FIG. 5 (c) represents manufacturing process of a photo-sensing element and a polycrystalline silicon TFT;

FIG. 5 (d) represents manufacturing process of a photo-sensing element and a polycrystalline silicon TFT;

FIG. 6 is a cross-sectional view of the photo-sensing element and the polycrystalline silicon TFT;

FIG. 9 is an equivalent circuit diagram in case a charge-blocking diode is used;

FIG. 10 represents a rear view, a side view, and a front view of an image display unit with the photo-sensing element integrated in it respectively.

DESCRIPTION OF THE PREFERRED EMBODIMENTS

Figure 3A:
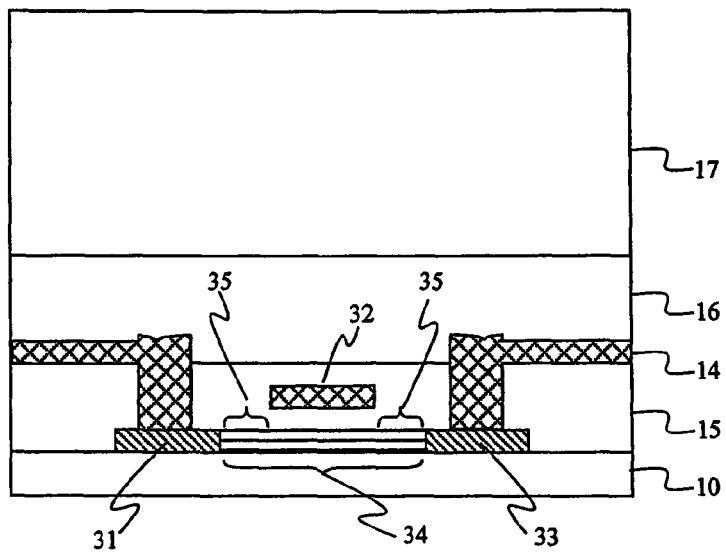
FIG. 3 represents a cross-sectional view and a diagram to show transfer characteristics of a polysilicon TFT manufactured at the same time as the photo-sensing element.

Description will be given below on embodiments of the invention referring to the attached drawings.

Embodiment 1

FIG. 1 represents conceptual drawings, each showing a photo-sensing element of the present invention. FIG. 1 (a) is a cross-sectional view of the photo-sensing element prepared on an insulating substrate, and FIG. 1 (b) is a top view of the same.

In FIG. 1, a first electrode 11 and a second electrode 12 made of a first semiconductor layer are disposed on an insulating substrate 10. Then, a light receiving layer (photoelectric conversion layer) 13 made of a second semiconductor layer is arranged on and between the electrodes 11 and 12. Interconnects 14 connected to each of the electrodes are insulated by interlayer insulating films 15 and 16, and all of these are covered with a passivation film 17. Each of the electrodes is connected to each interconnect via contact holes 18.

Phase status of the first semiconductor layer is different from that of the second semiconductor layer. Or, these semiconductor layers are different from each other in semiconductor material. The "phase" status means indicates a status of solid phase such as amorphous, crystalline or polycrystalline status.

Under the conception that the first semiconductor layer uses the same layer as the switching element, which constitutes the circuit, description will be given below by taking an example on polycrystalline silicon film with high electric conductivity, while the material is not limited to this, and the other material having high electric conductivity and suitable as a switching element for the circuit may be used. For instance, crystalline silicon film, crystalline silicon-germanium film, polycrystalline silicon-germanium film, crystalline germanium film or polycrystalline germanium film may be used.

Into the first semiconductor layer, highly-doped impurities (with density of majority carriers in the semiconductor layer being $1 \times 10^{19}/cm^3$ or higher under the condition with no light projected and with no voltage applied) are introduced, and these are used as a first electrode 11 and a second electrode 12. If the types of majority carriers of the first electrode and the second electrode are different from each other, this serves as a PIN type diode element. If the types are the same, it serves as a photoconductor. In both cases, it is turned to a photo-sensing element.

The second semiconductor layer is a layer where an intrinsic layer or very lowly-doped impurities (with density of majority carriers in the semiconductor layer being $1 \times 10^{17}/cm^3$ or lower under the conditions with no light projected and with no voltage applied) are introduced, and this layer fulfills the functions as a light receiving layer (photoelectric conversion layer).

The second semiconductor layer has higher photoelectric conversion efficiency than that of the first semiconductor layer. In the following, description will be given by taking an example on amorphous silicon film as a material, which has low leakage current when light is not projected, while the material is not limited to this and any type of material may be used so far as it has such property. For instance, microcrystalline silicon film, microcrystalline silicon-germanium film, amorphous silicon-germanium film, etc. may be used or organic semiconductor material may be used.

In FIG. 1, the light receiving layer 13 is made of amorphous silicon. This means that the area for combination can be set larger, and a photo-sensing element can be constituted, which has high sensitivity to visible light and with fewer leakage current when light is not projected. Further, because the first electrode 11 and the second electrode 12 are polycrystalline silicon film, TFT can be made up with the same polycrystalline silicon film. As a result, this TFT can be applied as a switching element of the sensor driver circuit.

Figure 11A:
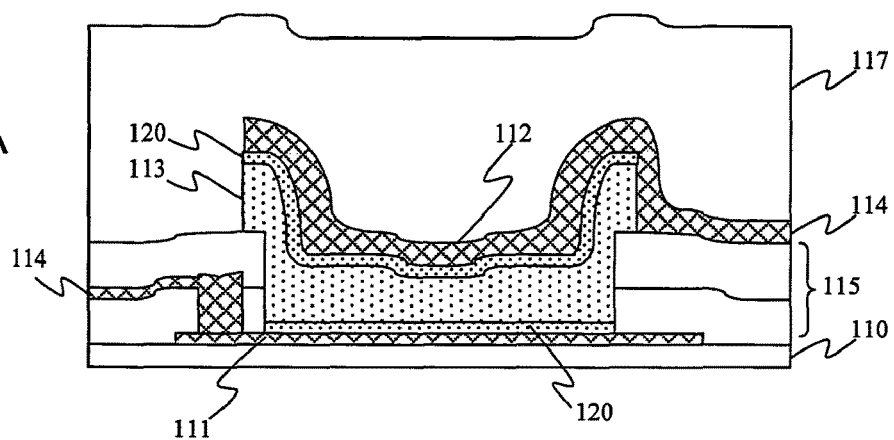
FIG. 11 represents cross-sectional views, each showing a photo-sensing element of the prior art.
Figure 11B:
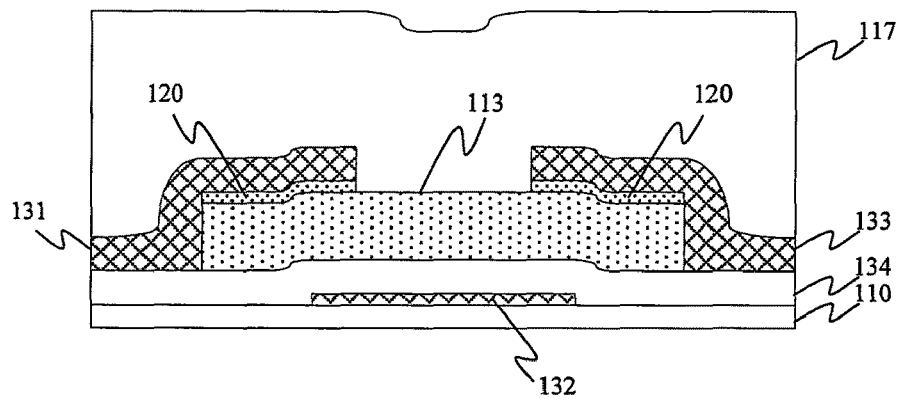

FIG. 2 is a diagram to show the relation between output current and illuminance in case of a TFT element using the amorphous silicon film shown in FIG. 11 (b) as the light receiving layer (photoelectric conversion layer) and of the photo-sensing element of the present invention shown in FIG. 1. Each of these elements outputs electric current corresponding to the illuminance. When output values of these elements are compared with each other, it is found that the element according to the present invention has output current by 10 times as high as that of the TFT element when light is projected, and it has output current of less than 1/10 of the latter when light is not projected. This reveals that the photo-sensing element of the present invention has higher sensitivity and is superior as a photo-sensing element.

Figure 3B:
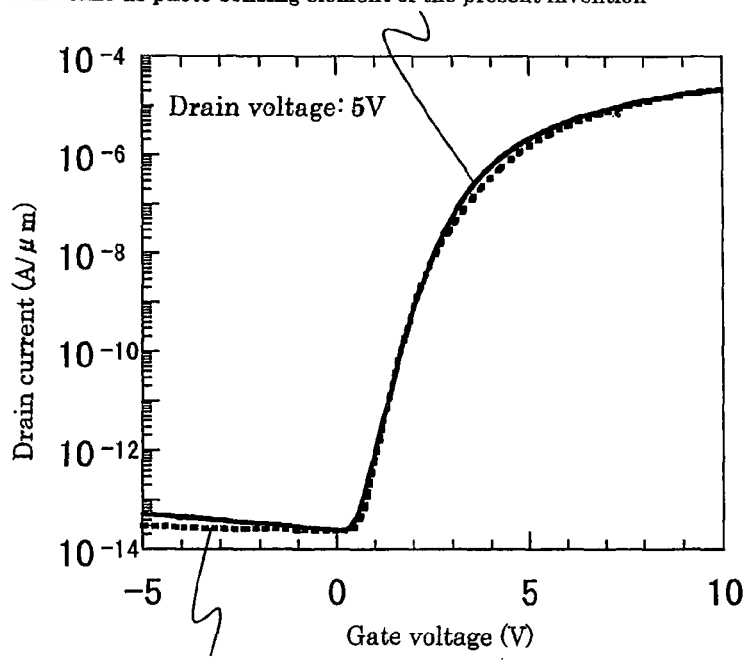
Figure 4A:
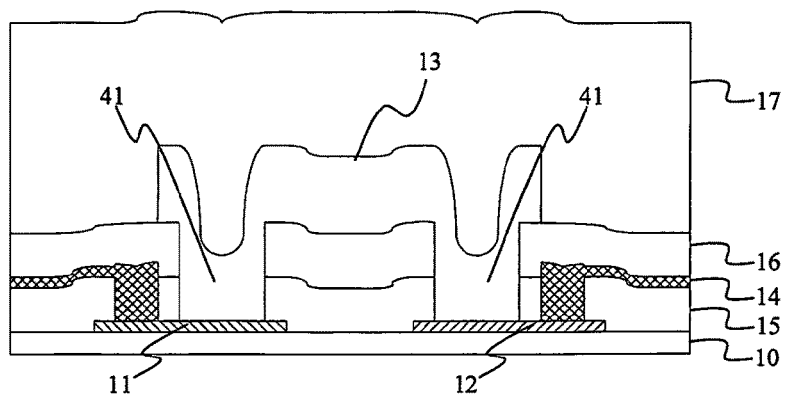
FIG. 4 represents cross-sectional views, each showing another structure of the photo-sensing element of the present invention.
Figure 4B:
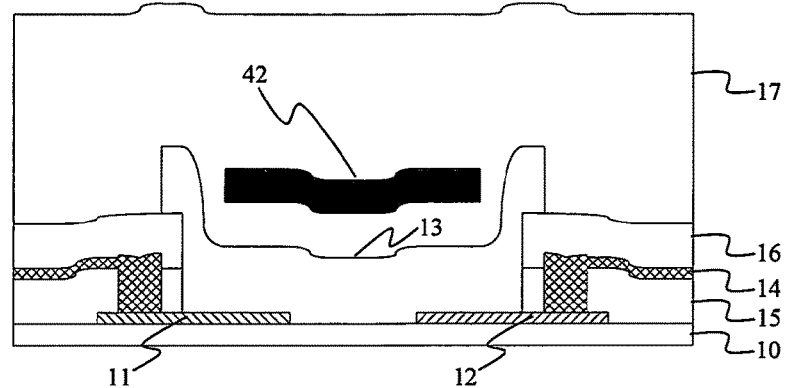
Figure 4C:
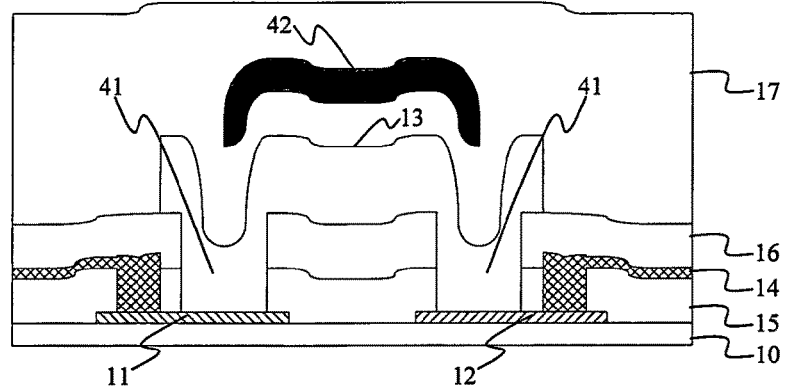
Figure 4D:
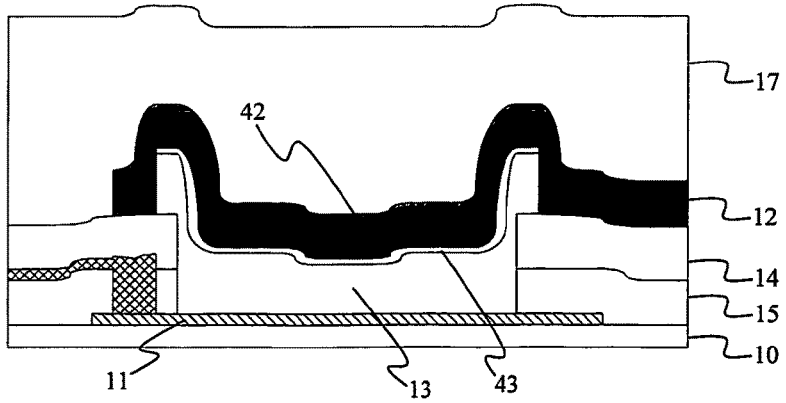
Figure 5A:
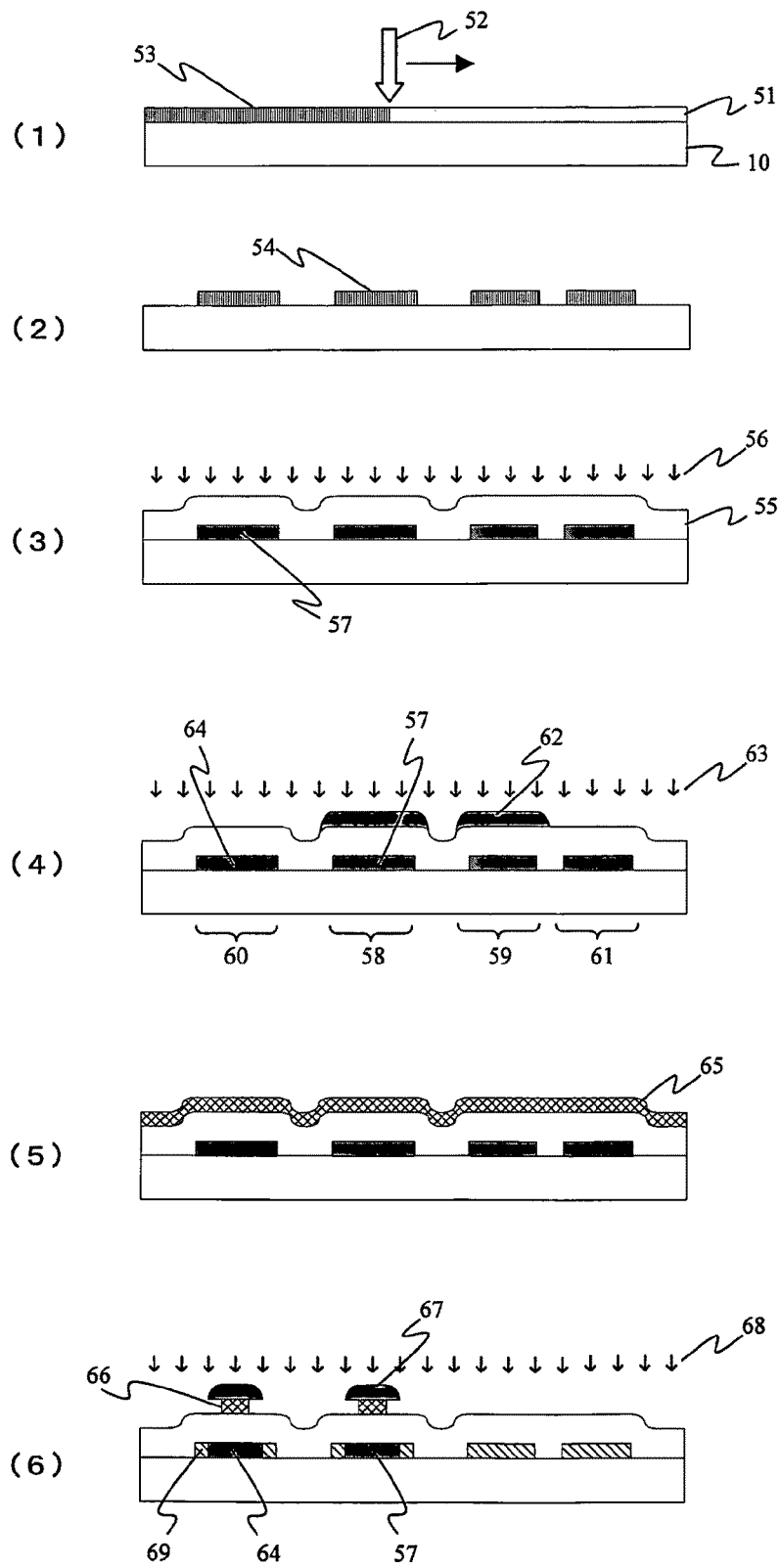
FIG. 5 (a) represents manufacturing process of a photo-sensing element and a polycrystalline silicon TFT.
Figure 5B:
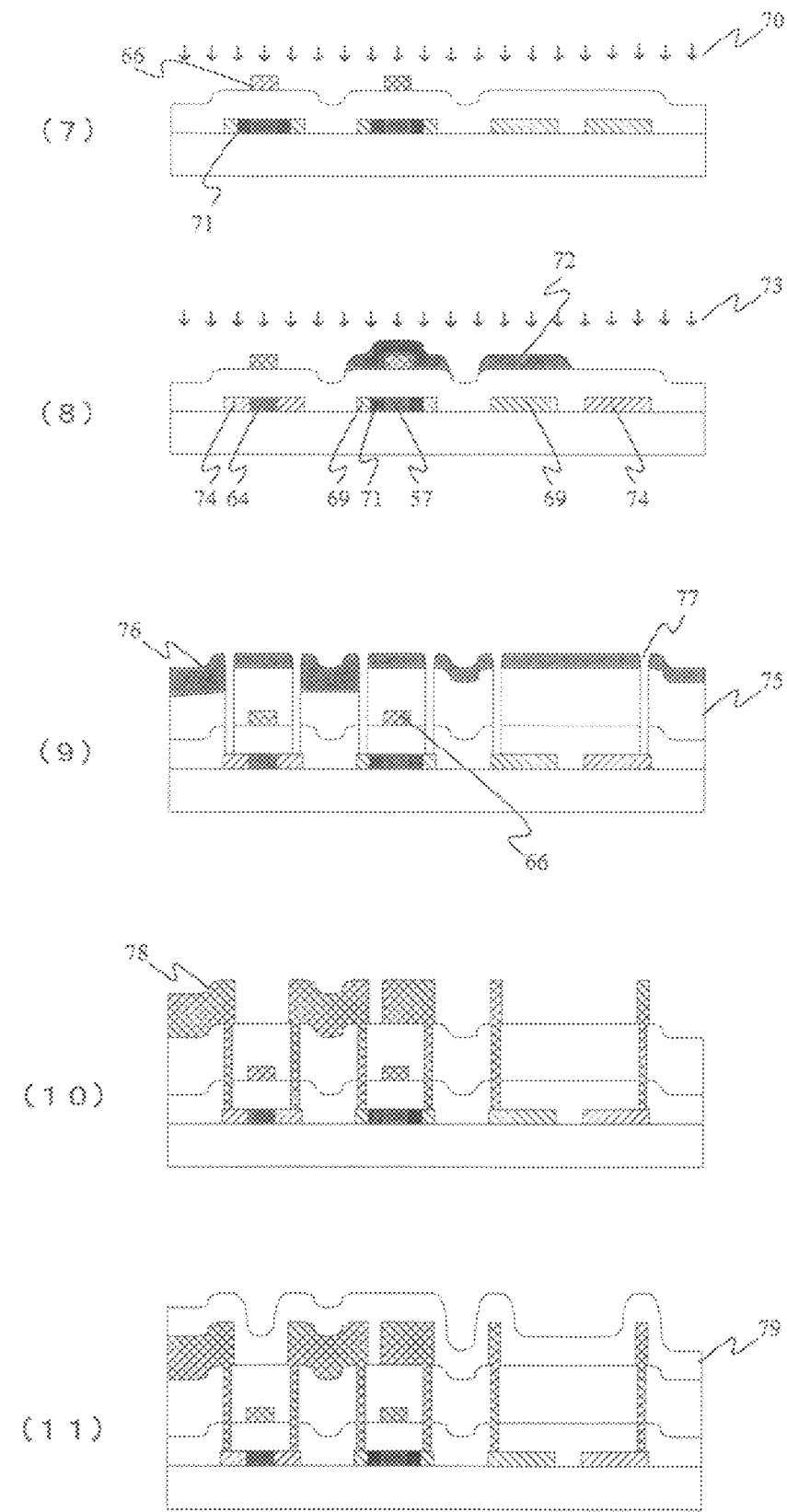
Figure 5C:
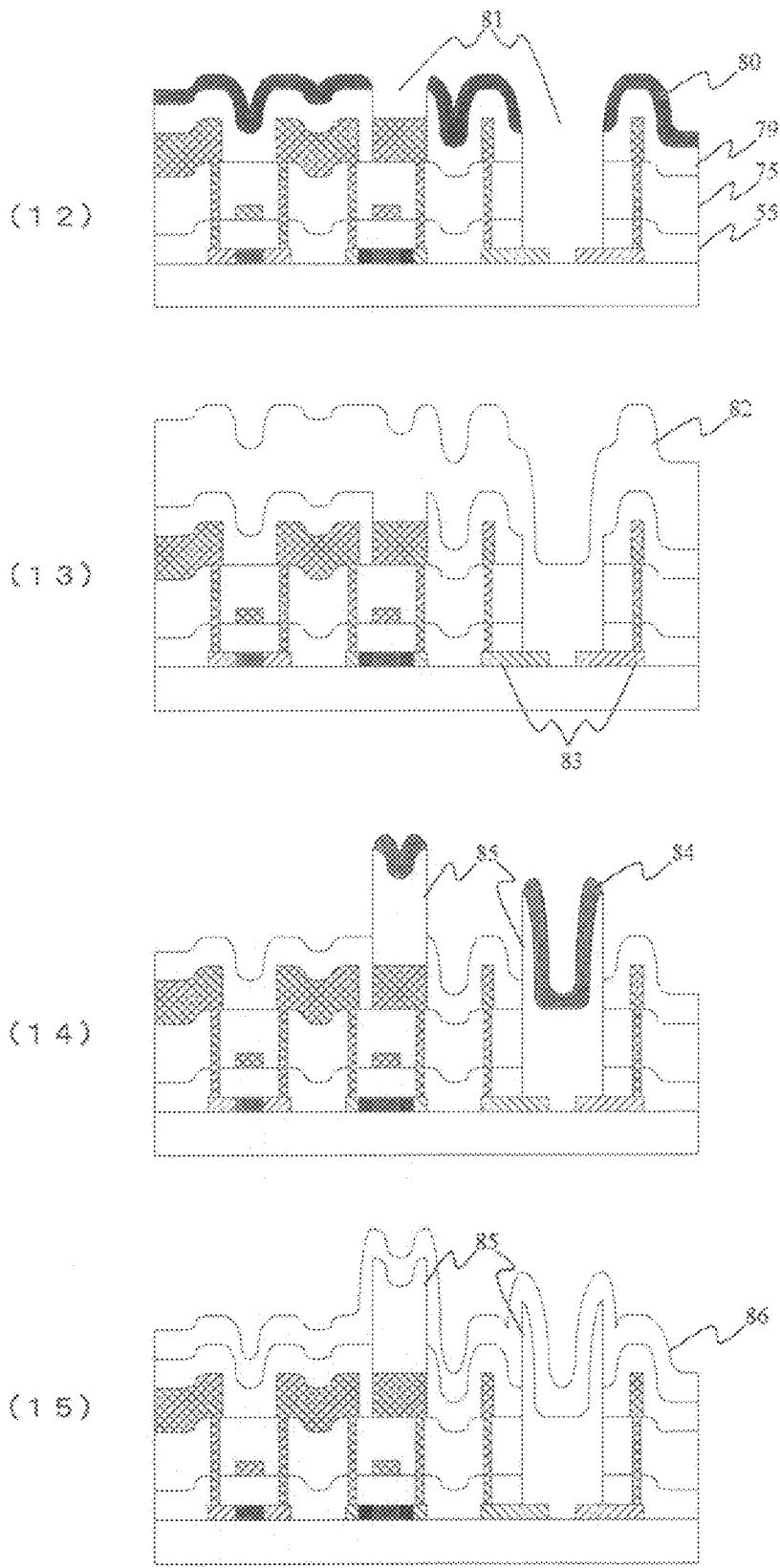
Figure 5D:
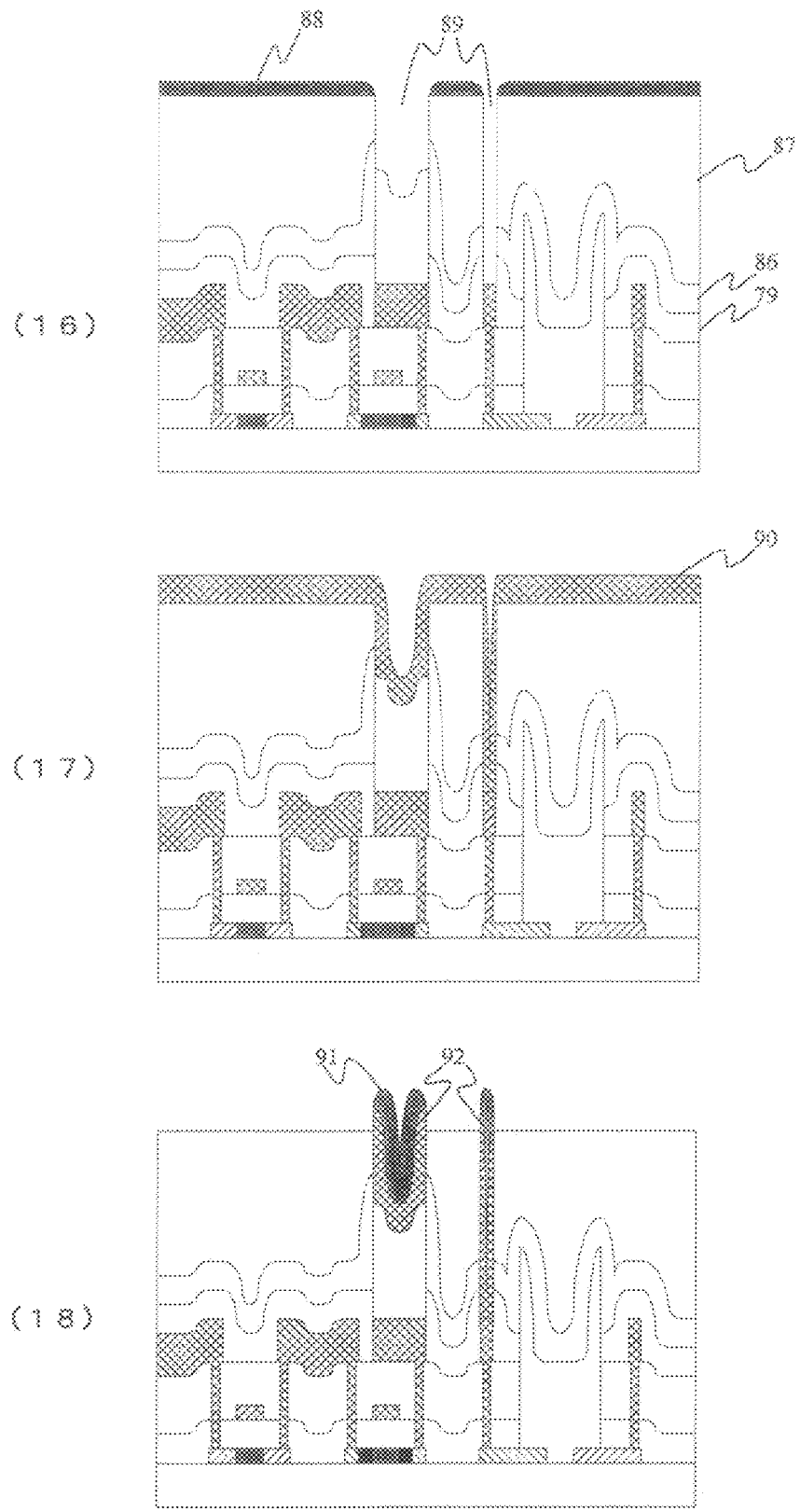

FIG. 3 (a) is a cross-sectional view of a polycrystalline silicon TFT prepared at the same time as the photo-sensing element of the present invention. This polycrystalline silicon TFT is characterized in that a source electrode 31, a channel 34, a drain electrode 33 and an LDD region 36 are made of polycrystalline silicon film to prepare the first electrode 11 and the second electrode 12 shown in FIG. 1 (a). By the use of a common material for these components, the manufacturing process can be simplified. A high-performance switching element using polycrystalline TFT and a high-performance photo-sensing element using amorphous silicon as the light receiving layer are prepared on the same insulating substrate by a common manufacturing process. Reference numeral 32 represents a gate electrode of the polycrystalline silicon TFT, and other reference numerals are the same as those shown in FIG. 1.

FIG. 3 (b) is a diagram to show transfer characteristics of the polycrystalline silicon TFT. In the diagram, the solid line indicates the characteristics of the polycrystalline silicon TFT prepared at the same time as the photo-sensing element of the present invention. The broken line represents transfer characteristics of the polycrystalline silicon TFT prepared by ordinary low temperature polycrystalline silicon manufacturing process. In FIG. 3 (b), when due consideration is given on the dispersion or variation of electric properties, it may be understood that switching characteristics are not changed. This suggests that the performance characteristics of the polycrystalline silicon TFT of the present invention are approximately the same as the characteristics of the TFT prepared by ordinary low temperature polycrystalline silicon manufacturing process.

FIG. 4 represents cross-sectional views of another structural example of the photo-sensing element of the present invention. In each of the figures from FIG. 4 (a) to FIG. 4 (d), at least one electrode is made of polycrystalline silicon film, and the light receiving layer is prepared by amorphous silicon layer subsequently deposited.

The difference between the photo-sensing element shown in FIG. 4 (a) from the photo-sensing element shown in FIG. 1

(a) is as follows: In FIG. 1 (a), the light receiving layer 13 is prepared on contact holes formed in the interlayer insulating films 14 and 15. On the other hand, in FIG. 4 (a), contact holes 41 are opened in the interlayer insulating films 14 and 15 on the first electrode 11 and the second electrode 12, and the light receiving layer 13 is prepared in it. As shown in FIG. 4 (a), when the light receiving layer 13 is separated by the contact holes 41, shifting route of the electric charge may become longer, but the route is extended in the same extent as film thickness of the interlayer insulating films, and the extension is shorter in comparison with the distance in horizontal direction.

The difference between the photo-sensing element shown in FIG. 4 (b) and the photo-sensing element shown in FIG. 1 (a) depends on whether or not the third electrode 42 is disposed above the first electrode 11 and the second electrode 12 via a passivation film 17. By applying voltage (negative charge) on the third electrode 42, leakage current can be reduced when light is not projected, and S/N ratio can be improved.

In the photo-sensing element shown in FIG. 4 (c), the third electrode 42 is disposed above the light receiving layer 13 of the photo-sensing element shown in FIG. 4 (a) via the passivation film 17. This is advantageous in that peeling-off of the film, which constitutes the electrode, can be prevented by the third electrode 42 when the contact holes are prepared, and that leakage current can be reduced and S/N ratio can be improved when light is not projected.

The photo-sensing element shown in FIG. 4 (d) is a photo-sensing element of vertical structure using a metal film as the second electrode 12. By adopting this vertical structure, the area for connection can be increased. Also, the distance of shifting of electric charge to the electrode can be determined by the thickness of the light receiving layer 13. As a result, higher output can be obtained. If the metal film is transparent, a light entering from above can be efficiently guided to the light receiving layer, and the photo-sensing element with higher sensitivity can be obtained. In FIG. 4 (d), a highly-doped impurity layer 43 is disposed on the site closer to the light receiving side near the contact surface between the second electrode 12 and the light receiving layer 13. In this case, it is desirable to introduce the impurities so that the type of the majority carriers will be reverse to that of the first electrode 11. In so doing, a vertical type PIN type diode element can be prepared. However, even when the highly-doped impurity layer is not present, potential barrier can be provided between the second electrode 12 and the light receiving layer 13, depending on the material used on the second electrode 12, and a Schottky diode element or a photoconductor can be disposed.

Next, referring to FIG. 5 (a) to FIG. 5 (d), description will be given on the process for manufacturing the photo-sensing element and the polycrystalline silicon TFT. Here, an example is taken on a case where photo-sensor is integrated in the pixel circuit of a liquid crystal display unit. In case of an area sensor, the processes can be added or omitted as necessary.

First, as shown in FIG. 5 (a) (1), an insulating substrate 10 is disposed. Here, description will be given on a case where inexpensive glass substrate is used as the insulating substrate, while it can be prepared on a plastic substrate typically represented by PET, an expensive quartz substrate, a metal substrate, etc. In case of the glass substrate, sodium, boron, etc. are contained in the substrate, and this may cause contamination to the semiconductor layer. In this respect, it is desirable to deposit an undercoating film such as silicon oxide film, silicon nitride film, etc. on the surface. On the upper surface, an amorphous silicon film or a microcrystalline silicon film 51 is deposited by CVD. Then, excimer laser 52 is irradiated to the amorphous silicon film 51, and a polycrystallized silicon film 53 is prepared.

Next, as shown in FIG. 5 (a) (2), the polycrystalline silicon film 53 is processed to prepare a polycrystalline silicon film 54 of island-like shape by photolithographic process. Then, as shown in FIG. 5 (a) (3), a gate insulating film 55 made of silicon oxide film is deposited by CVD. The material of the gate insulating film is not limited to silicon oxide film. It is desirable to select a material, which can satisfy the requirements such as high dielectric constant, high insulating property, low fixed charge, low interface trapped charge, low density of trapping state, and process coordination. Through the gate insulating film 55, ions 56 are implanted to the entire polycrystalline silicon film 54 in island-like shape. Then, boron is introduced, and an NE layer (lowly-doped boron injection layer) 57 is formed.

Further, as shown in FIG. 5 (a) (4), among an N type TFT region 58, an N type electrode region 59, a P type TFT region 60, and a P type electrode region 61, the N type TFT region 58 and the N type electrode region 59 are determined as non-injection regions by using a photo-resist 62 in the photolithographic process. Then, ions 63 are implanted, and phosphorus is introduced, and a PE layer (lowly-doped phosphorus injection layer 64) is prepared.

The impurities in the NE layer (lowly-doped boron injection layer 57) and the PE layer (lowly-doped phosphorus injection layer 64) are used for the purpose of adjusting the threshold value of TFT. As the dosage for ion implantation, the optimal value between $1\times10^{11}$ cm$^{-2}$ and $1\times10^{13}$ cm$^{-2}$ is introduced. In this case, it is known that the density of majority carriers in the lowly-doped boron injection layer 57 and the lowly-doped phosphorus injection layer 64 is in the range from $1\times10^{15}$/cm$^3$ to $1\times10^{17}$/cm$^3$. The optimal value of the boron injection quantity is determined by the threshold value of the N type TFT, and the optimal value of the phosphorus injection quantity is determined by the threshold value of the P type TFT.

Next, as shown in FIG. 5 (a) (5), a metal film 65 for the gate electrode is deposited by CVD or by sputtering. The metal film for the gate electrode may not necessarily be a metal film, and a polycrystalline silicon film with low resistance prepared by introducing the highly-doped impurities may be used.

Next, as shown in FIG. 5 (a) (6), the metal film 65 for gate electrode is processed by the photolithographic process, and a gate electrode 66 is prepared. By using the same photo-resist 67, ions 68 are implanted. Then, phosphorous is introduced, and an N+ layer (highly-doped phosphorus injection layer 69) is prepared. It is desirable that the dosage of phosphorus in the ion implantation is $1\times10^{15}$ cm$^{-2}$ or higher because the resistance of the electrode should be sufficiently decreased. In this case, the density of majority carriers in the highly-doped phosphorus injection layer 69 will be $1\times10^{19}$/cm$^3$ or higher.

After the resist 67 as shown in FIG. 5 (a) (6) is removed, phosphorus is introduced as shown in FIG. 5 (a) (7) to both sides of the gate electrode 66 by implanting the ions 70 using the gate electrode 66 as a mask, and an N− layer (moderately-doped phosphorus injection layer 71) is prepared. This introduction of the impurities has the purpose of improving the reliability of electric properties of the N type TFT. As the dosage in the ion implantation, the optimal value is used between the dosage of the lowly-doped boron injection layer 57 and the highly-doped phosphorus injection layer 69, i.e. in the range from $1\times10^{11}$ cm$^{-2}$ to $1\times10^{15}$ cm$^{-2}$. In this case, the density of majority carriers in the N− layer (moderately-doped phosphorus injection layer 71) will be in the range from $1\times10^{15}$ to $1\times10^{19}/cm^3$.

In the present embodiment, in the preparation of the N− layer (moderately-doped phosphorus injection layer 71), over-etching of the gate electrode 66 against the photo-resist 67 is used. The advantage of the use of the over-etching is that the photo-mask and photolithographic process can be eliminated and that the region of the N− layer (moderately-doped phosphorus injection layer 71) with respect to the gate electrode 66 can be uniquely determined. However, it is disadvantageous in that the N− layer cannot be sufficiently maintained when the extent of the over-etching is low. When the over-etching (processing error) is low, the N− layer may be determined by newly adding the photolithographic process.

Next, as shown in FIG. 5 (b) (8), non-injection areas of the N type TFT region and the N type electrode region are determined by using the photo-resist 72. Then, boron is introduced by implantation of ions 73 into the P type TFT region and the P type electrode region, and a P+ layer (highly-doped boron injection layer 74) is prepared. It is desirable that the dosage of ion implantation is $1\times10^{15}$ cm$^{-2}$ or higher because the resistance of the electrode must be decreased sufficiently. In this case, the density of majority carriers in the P+ layer will be $1\times10^{19}/cm^3$ or higher. Through the processes as described above, the electrodes of TFT and the photo-sensing element can be prepared.

In the present embodiment, special notice must be given on the fact that the same quantity of boron as in the NE layer (lowly-doped boron injection layer 57) is introduced into the PE layer (lowly-doped phosphorus injection layer 64), and that the same quantity of phosphorus as in the N− layer (moderately-doped phosphorus injection layer 71) and the N+ layer (highly-doped phosphorus injection layer 69) is introduced into the P+ layer (highly-doped boron injection layer 74). These are the impurities, which need not be introduced initially. For the purpose of maintaining the types of majority carriers in the electrodes of TFT and the photo-sensing element, it is necessary to introduce phosphorus and boron in such quantities as to offset each other. In the present embodiment, it is advantageous in that the photolithographic process can be simplified and that the number of the photo-masks used can be reduced, while it is disadvantageous in that many defects occur in the active layer of the P type TFT. In case the characteristics of the P type TFT cannot be ensured, it is desirable to increase the number of the photo-masks and the number of the photolithographic processes and not to introduce unnecessary quantity of impurities by blocking the PE layer and the P+ layer.

Next, as shown in FIG. 5 (b) (9), an interlayer insulating film 86 is deposited above the gate electrode 66 by CVD using TEOS (tetraethoxy silane) as raw material. Then, annealing is performed for activation of the introduced impurities. Next, a contact hole 77 is prepared on electrode portion by using a photo-resist 76 in the photolithographic process. The interlayer insulating film 75 is used to insulate the interconnects as prepared later from the gate electrode of the lower layer and the polycrystalline semiconductor layer. In this respect, any type of film may be used so far as it has insulating property. However, parasitic capacitance must be reduced, and it is desirable to use a material, which has low specific dielectric constant and low film stress so that it leads to good process coordination to the thickening of the film. Further, to be compatible with display function, the transparency of the film is important, and it is desirable to use a material, which has high transmittance to the visible light. In the present embodiment, silicon oxide film using TEOS gas as raw material is used as an example.

Next, as shown in FIG. 5 (c) (10), the materials for interconnects are deposited, and interconnects 78 are prepared by the photolithographic process. Further, as shown in FIG. 5 (c) (11), a passivation film 90 is prepared by CVD. If necessary, after the passivation film 79 is prepared, additional annealing is performed to improve the characteristics of TFT. Any type of film may be used so far as it has insulating property as in the case of the interlayer insulating film 75.

Next, as shown in FIG. 5 (c) (12), contact holes 81 are formed in a passivation film 79, an interlayer insulating film 75, and a gate insulating film 55 by using photo-resist 80 in the photolithographic process. There are the cases where the holes to interconnects can be prepared or the cases where holes are prepared to the polycrystalline silicon electrode, depending on the layers where contact must be maintained. By selective etching using the layer for forming interconnects as stopper, these contact holes can be prepared together at one time. When higher fabrication accuracy is required, it is possible to process independently by adding the photolithographic processes.

Next, as shown in FIG. 5 (c) (13), an amorphous silicon film 82 is deposited by CVD. In this case, in order to lower the level of the interface of the polycrystalline silicon electrode 83 and the amorphous silicon film 82, surface reforming process or cleaning process of the polycrystalline silicon electrode 83 should be added. As a method for this purpose, cleaning with hydrofluoric acid is known, while the other method may be used. It is desirable to have such conditions for deposition that hydrogen content in the amorphous silicon film 82 is about 10 atm % or more. In the amorphous silicon 82, there are many non-combined bonds, and these are turned to recombination sites for electron-hole pairs generated by the projection of light. Hydrogen atoms in the amorphous silicon film 82 have such effects as to terminate or inactivate the non-combined bonds. When hydrogen is introduced after the deposition, hydrogen cannot be introduced into the amorphous silicon film 82, and this causes the decrease of performance characteristics of the sensor. The amorphous silicon film 82 is basically an intrinsic layer where impurities cannot be introduced. When the element of vertical structure as shown in FIG. 4 (d) is adopted, highly-doped impurity induced layer 43 can be prepared in the amorphous silicon layer 13 near the top electrode and the bottom electrode by intermingling the impurities into raw material gas. As a result, leakage current can be reduced when light is not projected.

Next, as shown in FIG. 5 (c) (14), the amorphous silicon film 82 is processed to an island-like sensor photoelectric conversion region (amorphous silicon film 85) by using a photo-resist 84 through the photolithographic process. Then, as shown in FIG. 5 (c) (15), a passivation film 86 is prepared. This passivation film 86 particularly has the purpose to prevent the water from entering the amorphous silicon layer 85 from outside. In this respect, it is desirable to use a material with low moisture permeability such as silicon nitride rather than silicon oxide film, which has high moisture permeability.

Next, as shown in FIG. 5 (d) (16), an insulating film 87 to keep surface flatness is prepared by the coating insulating film and the insulating resist as necessary. Then, contact holes 89 are formed together via the flattening insulating film 87, the passivation films 79 and 86 by using the photo-resist 88 in the photolithographic process.

Then, as shown in FIG. 5 (d) (17), a transparent electrode film 90 made of a material such as ITO is prepared. Then, as shown in FIG. 5 (d) (18), a transparent electrode 92 is deposited by using a photo-resist 91 in the photolithographic process. Thereafter, a passivation film 17 as shown in FIG. 4 may be prepared on it if necessary, and contact holes may be formed by photolithographic process.

FIG. 6 is a cross-sectional view of a photo-sensing element and a polycrystalline silicon TFT prepared by the process shown in FIG. 5. In this case, a PIN photodiode type photo-sensing element 601 shown in FIG. 1 (a) and a vertical structured metal—semiconductor—metal photo-conductor type photo-sensing element 602 shown in FIG. 4 (d) are prepared. When a third electrode 42 shown in FIGS. 4 (b) and (c) and a second electrode 12 shown in FIG. 4 (d) are made of ITO 90 as shown in FIG. 5 (d) (17), a P type TFT 603 and an N type TFT 604 to constitute the circuit and the sensor elements of all structures shown in FIG. 4 can be prepared at the same time by the process described in the present embodiment.

The processes described in the present embodiment are characterized in that the activation processes of induced impurities and other high temperature thermal processing are performed. Then, a passivation film 79 is prepared as shown in FIG. 5 (b) (11) (i.e. after a passivation film 79 is formed and heat treatment has been performed), and an amorphous silicon layer 82 is prepared as shown in FIG. 5 (c) (13). The hydrogen atoms introduced at the time of deposition by CVD begin to be dissociated at the temperature near 320° C. As described above, it is impossible to have recovery by after-treatment. Thus, it is necessary to adjust the sequence of deposition after the deposition of the amorphous silicon layer so that it can be processed in low temperature processing.

Figure 7A:
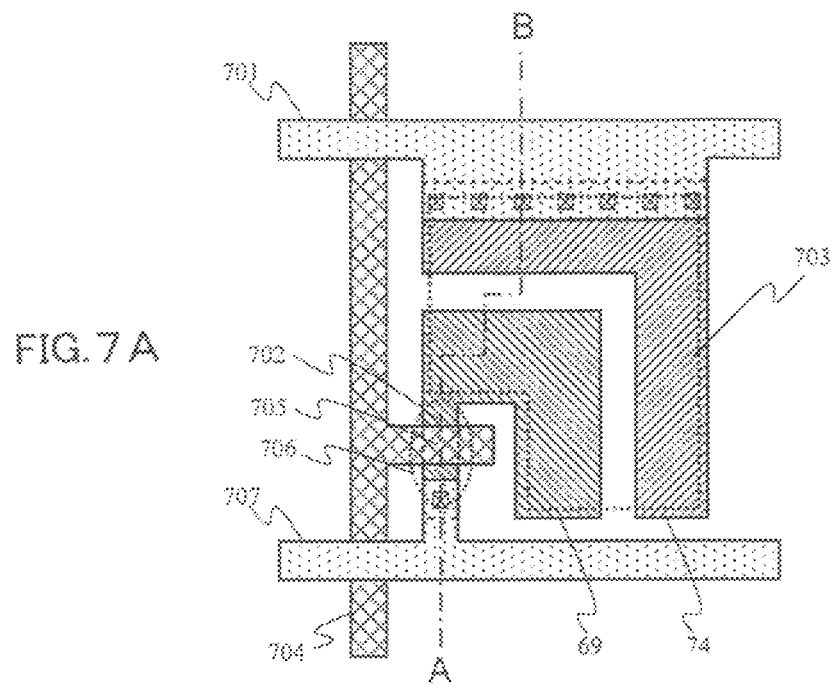
FIG. 7 represents a layout drawing, a cross-sectional view, and an equivalent circuit diagram of one pixel of an area sensor respectively.
Figure 7B:
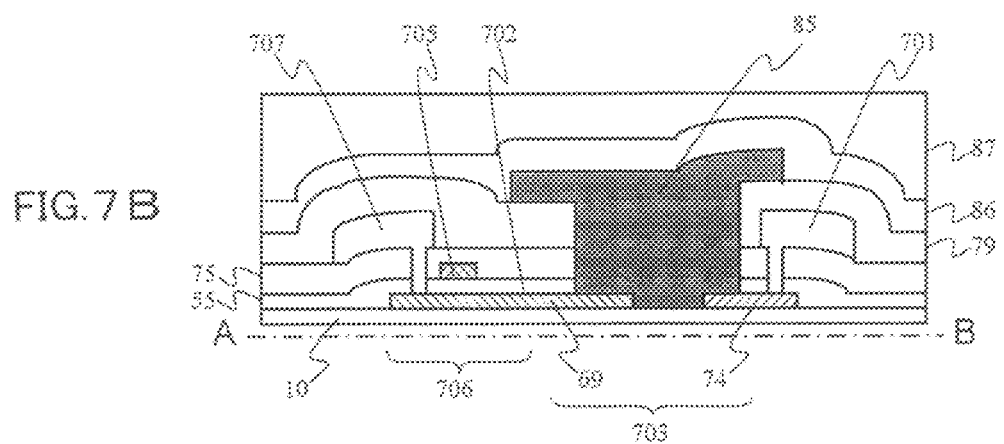
Figure 7C:
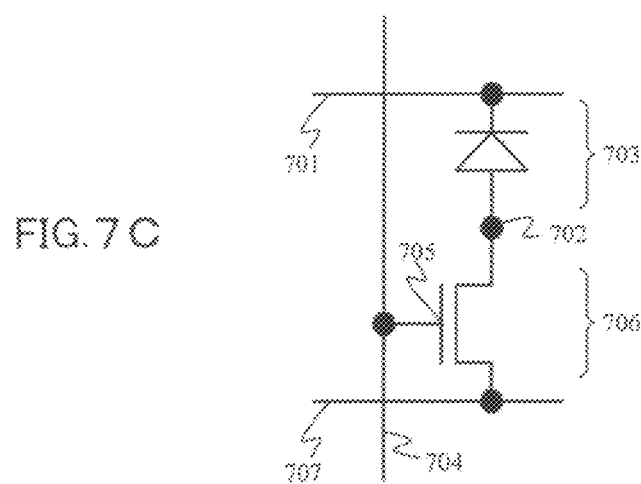

FIG. 7 (a) is a layout drawing of one pixel of an area sensor using the PIN photo-diode of the present invention. FIG. 7 (b) is a cross-sectional view along the broken line A-B in FIG. 7 (a), and FIG. 7 (c) is an equivalent circuit diagram of the pixel shown in FIG. 7 (a). First, description will be given on operation of the sensor by referring to FIG. 7 (c). The potential on a bias line 701 is set to a level lower than the potential on a sensor node 702, and the voltage on the sensor node 702 is reset. When the sensor is in operation, the potential on the bias line 701 is set to a value considerably higher that the potential on the sensor node 702. In this case, only very slight electric current flows to the photodiode 703 because of rectifying effect. When light is projected to the photodiode 703, more electric current flows than the case where light is not projected, and the potential on the sensor node 702 is increased. When TFT 706 is operated by applying potential on a gate electrode 705 via a gate line 704 at a certain time point, electric charge proportional to the illuminance of incident light is given to the data line 707, and the potential on the data line 707 is increased. The data of this potential is read by a sensor driver disposed outside the region of the area sensor. The electric charge is maintained by parasitic capacitance added to the sensor node 702. Auxiliary storage capacitor may be added if necessary. Reference numerals given in FIGS. 7 (a) and (b) are the same as those explained above, and detailed description is not given here.

Figure 8A:
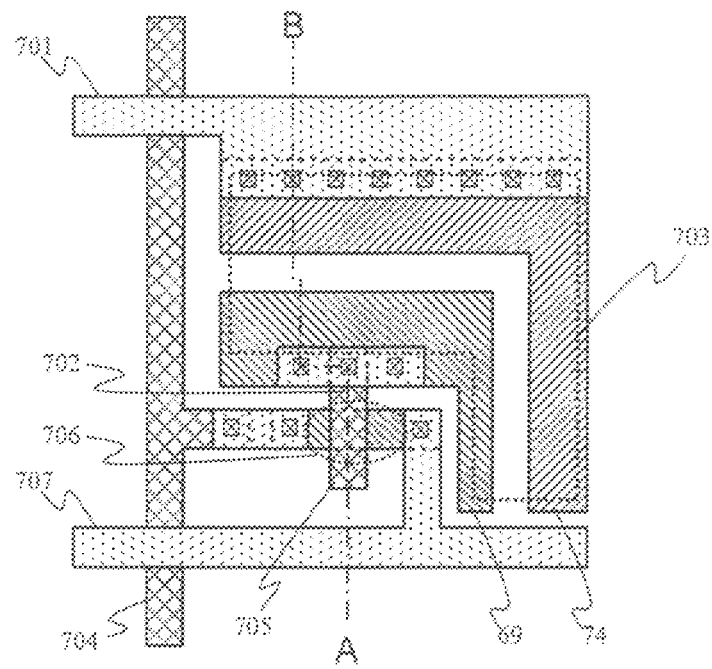
FIG. 8 represents a layout drawing, a cross-sectional view and an equivalent circuit diagram of one pixel of another area sensor respectively.
Figure 8B:
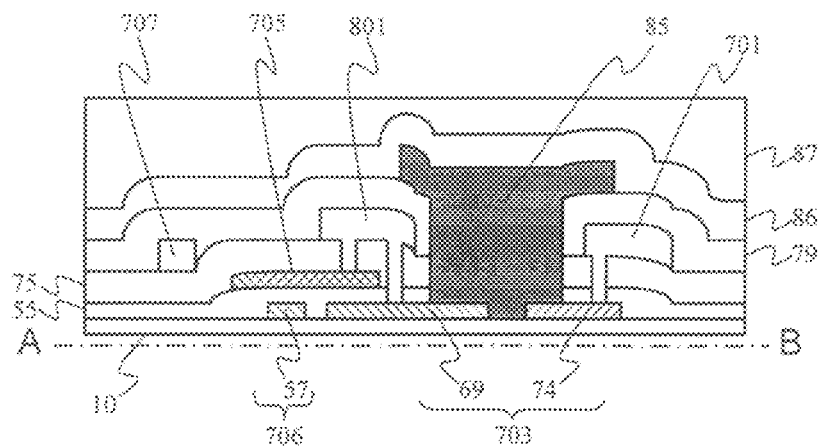
Figure 8C:
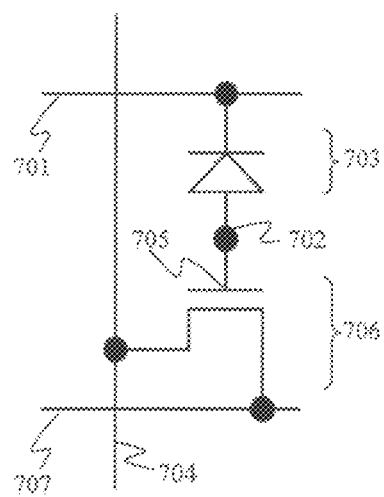

FIG. 8 (a) is a layout drawing of one pixel of an area sensor using another type of photodiode according to the present invention. FIG. 8 (b) is a cross-sectional view along the broken line A-B in FIG. 8 (a), and FIG. 8 (c) is an equivalent circuit diagram of the pixel shown in FIG. 8 (a). First, description will be given on operation of the sensor by referring to FIG. 8 (c). The potential on a bias line 701 is set to a value lower than the potential on a sensor node 702, and the voltage on the sensor node 702 is reset. When the sensor is in operation, the potential on the bias line 701 is set to a value considerably higher than the potential on the sensor node 702. In this case, only very slight electric current flows to the photo-diode 703 because of rectifying effect. When light is projected to the photodiode 703, more electric current flows than the case where light is not projected. As a result, the potential on the sensor node 702 is increased. In this case, the potential on the data line 707 is set to a value lower than the potential on the gate line 704 in advance (or, it may be reverse to it). Then, when the potential on the sensor node 702 is higher than the sum of the potential on the data line 707 (the potential on the gate line 704 in reverse case) and the threshold value of TFT 706, TFT 706 is turned to "on" state, and the data line 707 has the potential approximately equal to the potential on the gate line 704. The change of the data of the potential on the sensor node 702 is read by the sensor driver provided outside the region of the area sensor. According to this design, this means that a signal can be issued regardless of the illuminance if TFT 706 is turned on during the time of sensor operation. Therefore, by changing the period of sensor operation, gray scale can be detected. An interconnect layer 801 shown in FIG. 8 (b) is disposed on the same layer as the bias line 701 and the data line 707, and it is connected to the gate electrode 705 of TFT 706 and to the anode of the photodiode 703 via the contact holes. Reference numerals given in FIGS. 8 (a) and (b) are the same as explained in the above, and detailed description is not given here.

As shown in FIG. 9, a method is known, according to which, when the sensor portion is a photoconductor 901, a current-voltage circuit is provided in the sensor driver region. Or, a charge-blocking diode 902 or a charge-blocking TFT is disposed between the sensor and the bias line 701 to block reverse flowing of electric charge during the transport of electric charge to the data line 707. FIG. 9 is an equivalent circuit diagram when the charge-blocking diode is used.

Embodiment 2

Examples of the area sensor are shown in FIG. 7 and FIG. 8. If a pixel circuit is arranged on each of pixels at the same time as the sensor, an image display unit with photo-sensor functions can be provided. A signal line, a gate line, etc. to send signals to the pixels may be added newly, or bias line, data line or gate line of the sensor may be used in common by adjusting the timing of the signal line.

FIG. 10 represents schematical drawings of an image display unit integrated with the photo-sensing element of the present invention. FIG. 10 (a) is a rear view of an image display unit. On a glass substrate 101, a printed board 103 for driver LSI comprising a driver LSI 102 is disposed. Via an FPC 104, a plurality of pixels formed on the front side of the image display unit are driven. FIG. 10 (b) is a side view of the image display unit. On front side of the image display unit, a photo-sensor 105 comprising the photo-sensing element of the present invention and a plurality of pixels 106 arranged on an image display region are disposed. FIG. 10 (c) is a front view of the image display unit. On a glass substrate 101, a peripheral driver circuit 107 for driving pixels 106, a photo-sensor driver processing circuit 108 for processing the output of the photo-sensor 105, a backlight, and other control circuits 109 are disposed.

In FIG. 10, sensor signals to correspond to external light from the photo-sensor 105 are processed by the photo-sensor driver processing circuit 108, and the signals are sent to the peripheral driver circuit 107, which drives the pixels 106. At the peripheral driver circuit 107, image quality such as luminance, contrast, etc. of the image display unit are controlled, depending on the sensor signals.

In FIG. 10, a part of the driver is composed of LSIs and these are mounted on rear surface via FPC. To meet the required performance characteristics, TFT arranged on the glass substrate can be used sequentially. In so doing, LSIs and the cost for mounting them can be reduced, and the decrease of mechanical reliability due to the mounting can be avoided. Also, the driver can be designed at the time of the designing of pixels, and this facilitates the customization of the components. According to the present invention, the sensor and its driver can be integrated on the glass substrate, and this makes it possible to arrange and mount the sensor and processing circuits at any desired position in compact arrangement.

The invention claimed is:

1. A photo-sensing element disposed on an insulating substrate, said photo-sensing element comprising a light receiving layer (photoelectric conversion layer) made of a second semiconductor layer being disposed at least between a first electrode and a second electrode, each made of a first semiconductor layer, said first and second semiconductor layers are different from each other in phase status or are made of semiconductor materials different from each other and
said light receiving layer made of said second semiconductor layer is disposed above said first and second electrodes made of said first semiconductor layer, and
said light receiving layer made of said second semiconductor layer and said first and second electrodes made of said first semiconductor layer connected directly within a contact hole opened in a plurality of insulating layers.

2. A photo-sensing element according to claim 1, wherein said first electrode and said second electrode are made of said first semiconductor layer, and said light receiving layer is made of said second semiconductor layer is disposed above said first semiconductor layer.

3. A photo-sensing element according to claim 1, wherein the types of majority carriers are different or the types are the same in said first electrode and said second electrode.

4. A photo-sensing element according to claim 1, wherein the first electrode and the second electrode are connected to a light receiving layer disposed in contact holes opened in a plurality of insulating layers.

5. A photo-sensing element according to claim 1, wherein each of the first electrode and the second electrode is connected by a light receiving layer prepared in contact holes opened in a plurality of insulating layers.

6. A photo-sensing element according to claim 1, wherein said first semiconductor layer is either a polycrystalline silicon thin-film or a polycrystalline silicon-germanium thin-film, and said second semiconductor layer is one of amorphous silicon thin-film, microcrystalline silicon thin-film, amorphous silicon-germanium thin-film, or microcrystalline silicon-germanium thin-film.

7. A photo-sensing element according to claim 1, wherein said density of majority carriers in said first semiconductor layer is $1\times10^{19}/cm^3$ or higher, and said density of majority carriers in said second semiconductor layer is $1\times10^{17}/cm^3$ or lower under the conditions with no light projected and with no voltage applied.

8. A photo-sensing element according to claim 1, wherein the first electrode and the second electrode are made of the first semiconductor layer, and a light receiving layer made of the second semiconductor layer above the first semiconductor layer and a third electrode are provided above the light receiving layer via an insulating film.

9. A photo-sensing element according to claim 8, wherein the third electrode has transmittance of 75% or more to a light in visible light range (from 400 nm to 760 nm).

10. A photo-sensing element according to claim 1, wherein the first electrode is made of the first semiconductor layer, and a light receiving layer made of the second semiconductor layer is disposed above the first semiconductor layer, and a second electrode made of metal layer is disposed above the second semiconductor layer.

11. A photo-sensing element according to claim 10, wherein both of the density of majority carriers in the second semiconductor layer near interface between the second semiconductor layer and the metal layer and the density of majority carriers in the first semiconductor layer are $1\times10^{19}/cm^3$ or higher, and the density of majority carriers in the second semiconductor layer near interface between the second semiconductor layer and the first semiconductor layer is $1\times10^{17}/cm^3$ or lower under the conditions with no light projected and with no voltage applied.

12. A photo-sensing device, comprising a photo-sensing element disposed on an insulating substrate and a photo-sensor driver circuit for processing an output from said photo-sensing element, wherein:
said photo-sensing element at least comprises a light receiving layer (photoelectric conversion layer) made of a second semiconductor layer being disposed between a first and second electrodes made of a first semiconductor layer, and said first and second semiconductor layers are different from each other in phase status or different from each other in semiconductor materials; and
said light receiving layer made of said second semiconductor layer is disposed above said first and second electrodes made of said first semiconductor layer, and
said light receiving layer made of said second semiconductor layer and said first and second electrodes made of said first semiconductor layer connected directly within a contact hole opened in a plurality of insulating layers, and
said photo-sensor driver circuit comprises a thin-film transistor, and a channel, a source electrode and a drain electrode of the thin-film transistor are made of said first semiconductor layer.

13. A photo-sensing device according to claim 12, wherein said first and second electrodes are made of said first semiconductor layer, and said light receiving layer made of said second semiconductor layer is provided above said first semiconductor layer.

14. A photo-sensing device according to claim 12, wherein the photo-sensing element is characterized in that the first electrode and the second electrode are made of the first semiconductor layer, a light receiving layer made of the second semiconductor layer is disposed above the first semiconductor layer and a third electrode is disposed above the light receiving layer via an insulating film.

15. A photo-sensing device according to claim 12, wherein the photo-sensing element is characterized in that the first electrode is made of the first semiconductor layer, a light receiving layer made of the second semiconductor layer is disposed above the first semiconductor layer, and a second electrode made of metal layer is disposed above the second semiconductor layer.

16. A photo-sensing device according to claim 12, wherein said first semiconductor layer is either a polycrystalline silicon thin-film or a polycrystalline silicon-germanium thin-film, and said second semiconductor layer is made of one of amorphous silicon thin-film, microcrystalline silicon thin-film, amorphous silicon-germanium thin-film, or microcrystalline silicon-germanium thin-film.

17. An image display unit, comprising a photo-sensor disposed on an insulating substrate, a photo-sensor driver circuit for processing a sensor signal from said photo-sensor, and a peripheral pixel driver for driving a plurality of pixels in response to said sensor signal, wherein:

said photo-sensing element comprises a light receiving layer (photoelectric conversion layer) made of a second semiconductor layer disposed between a first electrode and a second electrode, each made of a first semiconductor layer, and said first and second semiconductor layers are different from each other in phase status or are made of semiconductor materials different from each other; and said light receiving layer made of said second semiconductor layer is disposed above said first and second electrodes made of said first semiconductor layer, and said light receiving layer made of said second semiconductor layer and said first and second electrodes made of said first semiconductor layer connected directly with a contact hole opened in a plurality of insulating layers, and said photo-sensor driver circuit comprises a thin-film transistor, and a channel, a source electrode and a drain electrode of said thin-film transistor are made of said first semiconductor layer.

18. An image display unit according to claim 17, wherein said photo-sensing element is characterized in that said first electrode and said second electrode are made of said first semiconductor layer, and said light receiving layer made of said second semiconductor layer is disposed above said first semiconductor layer.

19. An image display unit according to claim 17, wherein said photo-sensing element is characterized in that the first electrode and the second electrode are made of the first semiconductor layer, and a light receiving layer made of the second semiconductor layer and disposed above the first semiconductor layer and a third electrode are provided above the light receiving layer via an insulating film.

20. An image display unit according to claim 17, wherein said photo-sensing element is characterized in that the first electrode is made of the first semiconductor layer, and a light receiving layer made of the second semiconductor layer is disposed above the first semiconductor layer, and a second electrode made of metal layer is disposed above the second semiconductor layer.

\* \* \* \* \*